(12) United States Patent
Vogel et al.

(10) Patent No.: US 10,036,507 B2
(45) Date of Patent: Jul. 31, 2018

(54) MULTI-POSITIONAL MOUNT FOR PERSONAL ELECTRONIC DEVICES WITH A MAGNETIC INTERFACE

(71) Applicant: NITE IZE, INC., Boulder, CO (US)

(72) Inventors: Frank Vogel, Boulder, CO (US); Paul Turner, Makawao, HI (US)

(73) Assignee: Nite Ize, Inc., Boulder, CO (US)

( * ) Notice: Subject to any disclaimer, the term of this patent is extended or adjusted under 35 U.S.C. 154(b) by 0 days.

(21) Appl. No.: 15/894,726

(22) Filed: Feb. 12, 2018

(65) Prior Publication Data

US 2018/0163918 A1    Jun. 14, 2018

Related U.S. Application Data

(63) Continuation of application No. 15/689,632, filed on Aug. 29, 2017, which is a continuation of application No. 14/526,350, filed on Oct. 28, 2014, now Pat. No. 9,765,921, which is a continuation of application No. 14/098,043, filed on Dec. 5, 2013, now Pat. No. 8,870,146, which is a continuation of application No. 13/485,894, filed on May 31, 2012, now Pat. No. 8,602,376.

(60) Provisional application No. 61/491,640, filed on May 31, 2011.

(51) Int. Cl.
| | | |
|---|---|---|
| F16M 11/00 | (2006.01) |
| F16M 11/14 | (2006.01) |
| F16M 11/04 | (2006.01) |
| F16M 13/00 | (2006.01) |
| F16M 13/02 | (2006.01) |
| F16B 1/00 | (2006.01) |
| F16M 11/22 | (2006.01) |
| H05K 5/02 | (2006.01) |

(52) U.S. Cl.
CPC .............. *F16M 11/14* (2013.01); *F16B 1/00* (2013.01); *F16M 11/04* (2013.01); *F16M 11/041* (2013.01); *F16M 11/22* (2013.01); *F16M 13/00* (2013.01); *F16M 13/022* (2013.01); *H05K 5/0204* (2013.01); *F16B 2001/0035* (2013.01); *F16M 2200/022* (2013.01); *Y10T 403/32631* (2015.01)

(58) Field of Classification Search
None
See application file for complete search history.

(56) References Cited

U.S. PATENT DOCUMENTS

| | | | | |
|---|---|---|---|---|
| 4,435,905 A * | 3/1984 | Bryan | ................. | G01B 7/02 33/613 |
| 4,492,036 A * | 1/1985 | Beckwith, Jr. | ........... | G01B 3/30 33/503 |

(Continued)

*Primary Examiner* — Monica E Millner
(74) *Attorney, Agent, or Firm* — Haynes and Boone, LLP

(57) ABSTRACT

A stand assembly for holding handheld electronic devices in a multitude of positions or locations having a first section with a curved end magnetically attached to second section having and indented surface. The first section also attaches to a surface, the second section either is contiguous with a portable electronic device, a carrying case, or other item; or has a means to attach to another surface. A high-friction elastomeric material, or similar friction producing material, helps to secure the first and second sections together, or the second section against another flat magnetic surface.

19 Claims, 3 Drawing Sheets

(56) References Cited

U.S. PATENT DOCUMENTS

| | | | | |
|---|---|---|---|---|
| 4,719,549 A * | 1/1988 | Apel | ............................ | F21S 2/00 362/398 |
| 6,350,076 B1 * | 2/2002 | Wagner | ................. | F16C 11/106 403/122 |
| 6,836,323 B2 * | 12/2004 | Schmadel | ............ | G01B 21/042 33/502 |
| 7,188,428 B2 * | 3/2007 | Blondeau | ................. | G01B 1/00 33/502 |
| 7,336,258 B1 * | 2/2008 | Goetsch | ................. | F16M 11/14 248/278.1 |
| 7,621,492 B2 * | 11/2009 | Omps | ................. | F16C 11/0619 248/181.1 |
| 8,176,927 B2 * | 5/2012 | Wu | ........................... | A61H 3/02 135/65 |
| 8,267,361 B1 * | 9/2012 | Dordick | ................. | F16M 11/14 248/178.1 |
| 8,295,770 B2 * | 10/2012 | Seil | ..................... | H04M 1/6091 455/41.2 |
| 8,366,064 B2 * | 2/2013 | Chen | .................... | F16M 11/043 224/416 |
| 8,602,376 B2 * | 12/2013 | Vogel | .................... | F16M 11/14 248/187.1 |
| 8,632,064 B2 * | 1/2014 | Salisbury, Jr. | ........ | B25J 17/0275 269/55 |
| 9,765,921 B2 * | 9/2017 | Vogel | .................... | F16M 11/14 |
| 2002/0096956 A1 * | 7/2002 | Erten | .................... | H02K 41/031 310/156.01 |
| 2004/0067096 A1 * | 4/2004 | Ersoy | .................... | B60G 7/005 403/137 |
| 2004/0118985 A1 * | 6/2004 | Omps | ................. | F16C 11/0619 248/181.1 |
| 2004/0188576 A1 * | 9/2004 | Carnevali | .............. | F16M 13/00 248/206.5 |
| 2005/0007225 A1 * | 1/2005 | Kruse | ................. | B60G 17/019 335/205 |
| 2009/0238637 A1 * | 9/2009 | Spratte | ................ | F16C 11/0604 403/127 |

\* cited by examiner

MULTI-POSITIONAL MOUNT FOR PERSONAL ELECTRONIC DEVICES WITH A MAGNETIC INTERFACE

CROSS REFERENCE TO RELATED APPLICATIONS

This application is a continuation of U.S. patent application Ser. No. 15/689,632 filed Aug. 29, 2017 which is a continuation of U.S. patent application Ser. No. 14/526,350 filed Oct. 28, 2014, now U.S. Pat. No. 9,765,921 issued Sep. 19, 2017, which is a continuation of Ser. No. 14/098,043 filed Dec. 5, 2013, now U.S. Pat. No. 8,870,146 issued Oct. 28, 2014, which is a continuation of U.S. patent application Ser. No. 13/485,894 filed May 31, 2012, now U.S. Pat. No. 8,602,376 issued Dec. 10, 2013, which claims the benefit of U.S. Provisional Patent Application No. 61/491,640, filed May 31, 2011, all of which applications are incorporated by reference herein in their entirety for all purposes.

BACKGROUND OF THE INVENTION

1. Field of the Invention

Embodiments of the present invention relate to a stand for holding handheld electronic devices; and more specifically, a stand that can hold the device in a multitude of positions or locations.

2. Description of Related Art

Personal electronic equipment such as cellular phones and handheld touch screen computers are generally designed so as to be held by the operator in one hand while screen input is given to the device with the thumb or with the other free hand. While these methods of touch screen operation are good while on the go, or during a quick interaction with the device; the operator may wish to use the touch screen to display information without holding it or to type with one or both hands without holding the device.

Prior methods of holding handheld electronic devices have proved limited in either the positions the devices can be held or to which surfaces the devices can be quickly attached.

SUMMARY

The present invention relates to a stand assembly for holding handheld electronic devices in a multitude of positions or locations. In one embodiment of the present invention, the stand assembly is comprised of two sections: the first section is comprised of a first end shaped to rest stably on a flat surface and a second end with a generally curved shape and constructed of a magnetic material; the second section being comprised of a front surface having an indentation to accept the generally curved end of the first section and a back surface comprising either a means for attaching to a surface or said front and back surfaces being contiguous with a handheld electronic device, a protective cover, or other item. The second section is further comprised of either being made from or including a magnet to attract magnetic material. The first and second sections of this embodiment of the invention are capable of being securely attached through the magnetic interaction of the curved end of the first section and the indentation on the front surface of the second section.

Another embodiment of the present invention also comprises a first section with an end shaped to rest stably on a flat surface that can has a means to mount to surfaces such as: screws, glue, epoxy, two sided tape, hooks, snaps, links, clasps, ties, Velcro, or any suitable means commonly known to those who practice in the art.

Another embodiment of the present invention also comprises a second section with a back surface with a means to mount a surface such as: screws, glue, epoxy, two sided tape, hooks, snaps, links, clasps, ties, Velcro, or any suitable means commonly known to those who practice in the art.

Another embodiment of the present invention also comprises a first section with an end shaped to rest stably on a flat surface that can be shaped to fit into the socket of an automobile cigarette lighter outlet.

Another embodiment of the present invention would also comprises a first section with an end shaped to rest stably on a flat surface that can be shaped to attach to irregular surfaces by way of a spring loaded or screw type clamp.

Another embodiment of the present invention also comprises a high-friction elastomeric material, or similar friction producing material, on the outer contact surface of the front of the magnetized second section. This allows the handheld electronic device to be removed from the first section and placed on a vertical magnetic surface without slipping.

Another embodiment of the present invention also comprises a high-friction elastomeric material, or similar friction producing material, on either the indentation on the front surface of the second section or the curved end of the first section. This prevents the indentation on the front surface of the second section from slipping on the curved end of the first section by creating friction to oppose gravity or other forces that may act on the magnetic coupling.

BRIEF DESCRIPTION OF THE DRAWINGS

1. Figures

2. References

Figure 1A:
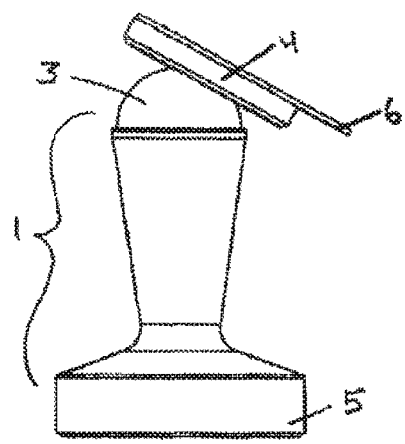
FIG. 1A (on Sheet 1) illustrates a side view of a stand assembly which includes the first and second sections attached together and to a handheld device according to an embodiment of the present invention.
Figure 1B:
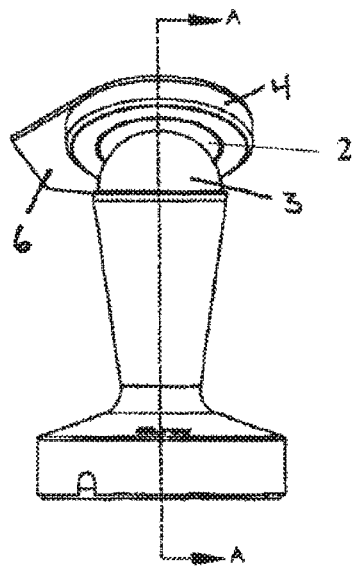
FIG. 1B (on Sheet 1) illustrates a side view of the stand assembly of FIG. 1A rotated 90 degrees according to an embodiment of the present invention.
Figure 1C:
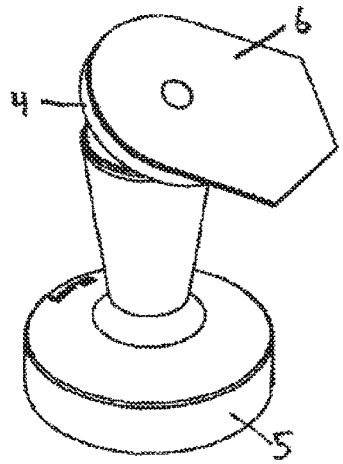
FIG. 1C (on Sheet 1) illustrates an oblique side view of a stand assembly showing the back surface of a second section where it attaches to a handheld device according to an embodiment of the present invention.
Figure 1D:
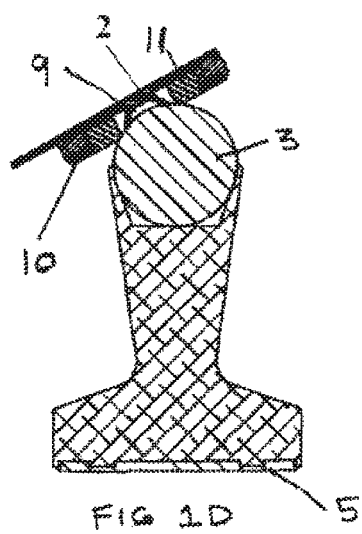
FIG. 1D (on Sheet 1) illustrates a cross-sectional view of a stand assembly showing a high-friction elastomeric material that rubs against a generally curved end of a first section according to an embodiment of the present invention.

1 First Section of Stand Assembly
2 Indentation In Second Section of Stand Assembly
3 Curved end of the First Section
4 Second Section of Stand Assembly
5 End of First Section Shaped To Rest Stably On a Flat Surface
6 Means For Attaching to Second Section to a Surface
7 Handheld Device 8 Flat Surface
9 High-Friction Elastomeric Material, or Similar friction Producing Material, On The Indentation On The Front Surface of The Second Section
10 High-Friction Elastomeric Material, or Similar Friction Producing Material, On The Outer Contact Surface of The Front of The Second Section
11 Magnetic Material
12 Stem to Engage Into The Cigarette Lighter Receptacle of an Automobile
13 Spring Loaded Jaws To Clamp Onto Irregular Surfaces

DETAILED DESCRIPTION OF A PREFERRED EMBODIMENT

For the purposes of promoting an understanding of the principles of the invention, reference will now be made to the embodiments illustrated in the drawings and specific language will be used to describe the same. However, the illustrated embodiments are merely exemplary and many additional embodiments of this invention are possible. For example this invention is shown in use with portable electronic devises; however this invention is not intended to be limited to portable electronic devices. It is understood that no limitation of the scope of the invention is thereby intended. Any alterations and further modifications in the illustrated devices, and such further application of the principles of the invention as illustrated herein are contemplated as would normally occur to one skilled in the art to which the invention relates.

Unless otherwise indicated, the drawings are intended to be read (e.g., arrangement of parts, proportion, degree, etc.) together with the specification, and are to be considered a portion of the entire written description of this invention. As used in the following description, the terms "horizontal", "vertical", "left", "right", "up" and "down", as well as adjectival and adverbial derivatives thereof (e.g., "horizontally", "rightwardly", "upwardly", etc.), simply refer to the orientation of the illustrated structure as the particular drawing figure faces the reader. Similarly, the terms "inwardly" and "outwardly" generally refer to the orientation of a surface relative to its axis of elongation, or axis of rotation, as appropriate.

FIGS. 1A, 1B, 1C and 1D all depict an embodiment of a multi-positional stand assembly for a handheld device comprised of two sections. The 1 first section has a 5 first end shaped so as to rest stably on a flat surface and a 3 second curved end constructed of a magnetic material. The 4 second section includes an 2 indentation for receiving the 3 second curved end of the 1 first section, a 6 means for connecting the 4 second section to an optional 7 handheld device, a 11 magnetic material for attracting the 3 second curved end of the 1 first section, a 9 high-friction elastomeric material, or similar friction producing material on the indentation on the front surface of the 4 second section for arresting slipping of the 4 second section relative to the 1 first section, and a 10 high-friction elastomeric material, or similar friction producing material on the outer contact surface of the 4 second section to hold the 4 second section to a vertical surface when the 1 first section is removed. The 1 first and 4 second sections of this embodiment of the invention are capable of being securely attached through the magnetic interaction of the 3 curved end of the first section and the 2 indentation on the front surface of the 4 second section.

While not pictured, the 4 second section can also comprise either a means for attaching to a surface such as: screws, glue, epoxy, two sided tape, hooks, snaps, links, clasps, ties, Velcro, or any suitable means commonly known to those who practice in the art; or the front and back surfaces of the 4 second section can be contiguous with a 7 handheld electronic device, a protective cover, or other item. The second section can also be comprised of either being made from a magnetic material.

While not pictured, the 1 first section can also comprise a flat end suitable for resting on a flat surface with a means for attaching to a surface such as: screws, glue, epoxy, two sided tape, hooks, snaps, links, clasps, ties, Velcro, or any suitable means commonly known to those who practice in the art.

When the 1 first section is connected to the 4 second section and attached to a 7 handheld device, the 7 handheld device can be moved freely to a multitude of positions. Since the amount of leverage the 7 handheld device has on the 3 curved end of the first section and 2 indentation on the front surface of the second section varies depending on the 7 handheld device's position, the use of a 9 high-friction elastomeric material, or similar friction producing material on the indentation on the front surface of the 4 second section for arresting slipping of the 4 second section relative to the 1 first section eliminates the potential slipping of the 1 first and 4 second sections, or the need for use of 11 magnetic material of such strength as to make disconnecting the 1 first and 4 second sections difficult.

Figure 2:
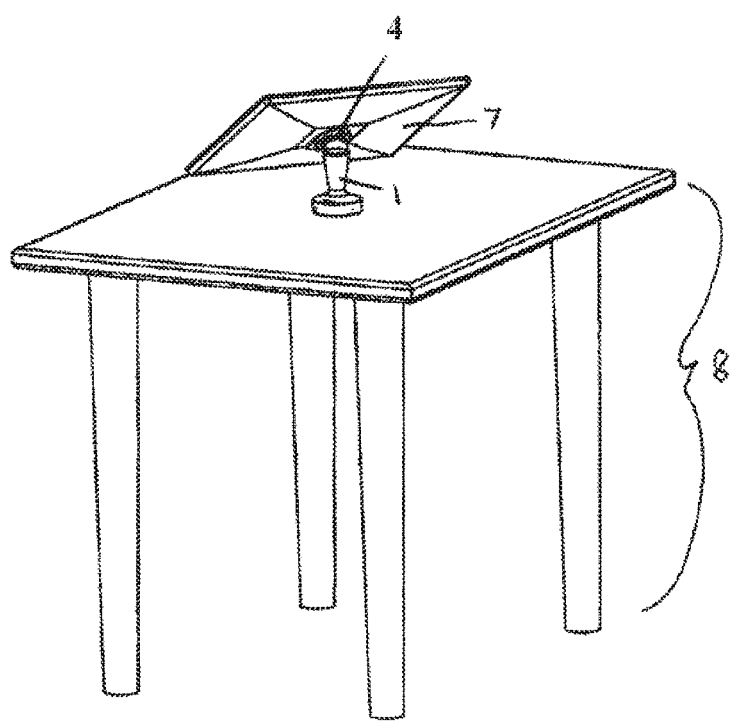
FIG. 2 (on Sheet 2) illustrates a stand assembly placed on a flat surface and attached to a handheld electronic device according to an embodiment of the present invention.
Figure 3:
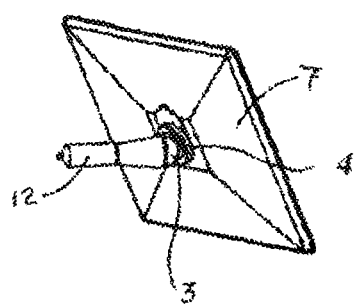
FIG. 3 (on Sheet 3) illustrates a stand assembly adapted to connect to the cigarette lighter receptacle of an automobile according to an embodiment of the present invention.
Figure 4:
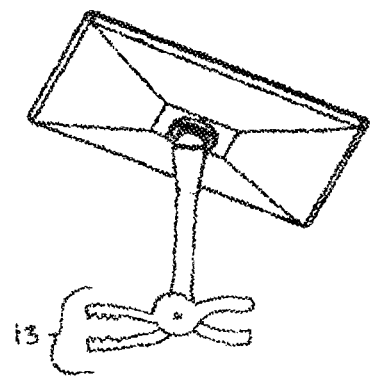
FIG. 4 (on Sheet 3) illustrates a stand assembly adapted to include a spring loaded clamp for attaching a stand assembly to an irregular surface according to an embodiment of the present invention.

FIG. 2 depicts an embodiment of the invention where the 1 first section has a 5 second end shaped to rest stably on a 8 flat surface such as a table, desk or the like. FIG. 3 depicts another embodiment of the invention where the 1 first section includes a 12 stem to engage into the cigarette lighter receptacle of an automobile, this stem could also be adapted to engage any sort of plug. FIG. 4 depicts another embodiment of the invention where the 1 first section also comprises 13 spring loaded jaws to clamp onto irregular surfaces although any similar means for clamping could be used.

Various modifications and additions can be made to the exemplary embodiments discussed without departing from the scope of the present invention. For example, while the embodiments described above refer to particular features, the scope of this invention also includes embodiments having different combinations of features and embodiments that do not include all of the described features. Accordingly, the scope of the present invention is intended to embrace all such alternatives, modifications, and variations as fall within the scope of the claims, together with all equivalents thereof While the above description contains many specificities, these should not be construed as limitations on the scope of the invention, but rather as an exemplification of one preferred embodiment thereof. Many other variations are possible. Accordingly, the scope of this invention should be determined not by the embodiments, but by the applied claims and their legal equivalents.

What is claimed is:

1. A stand assembly comprising:
a first section having a first end shaped with a curved surface, said curved surface of said first section constructed of a first magnetic material; and
a second section having a front surface, said front surface having an indentation, said indentation capable of receiving said curved end of said first section and being of a size which can encompass a portion, but less than the whole diameter, of said curved end of said first section, said second section having a second magnetic material capable of holding said first and said second sections together, wherein the second section includes a first piece of friction producing material, the friction producing material on an outer contact surface of the second section, adjacent to the second magnetic material and further from a center point of the indentation than the second magnetic material.

2. The stand assembly of claim 1, wherein the second magnetic material directly interfaces with the curved surface.

3. The stand assembly of claim 1, wherein the second magnetic material contacts the curved surface.

4. The stand assembly of claim 1, wherein the front surface having an indentation, said indentation capable of receiving said curved end of said first section and being of a size which can encompass a portion, but less than the whole diameter, of said curved surface of said first section, said second section having the second magnetic material configured to securely attach to the first section through magnetic interaction of the curved surface of the first section with the indentation on the front surface of the second section.

5. The stand assembly of claim 1, wherein said first section further comprises a means for laying stably flat on a surface.

6. The stand assembly of claim 1, wherein the friction producing material is high-friction material.

7. A stand assembly comprising:
a first section having a first end shaped with a curved surface, said curved surface of said first section constructed of a first magnetic material; and
a second section having a front surface, said front surface having an indentation, said indentation capable of receiving said curved end of said first section and being of a size which can encompass a portion, but less than the whole diameter, of said curved end of said first section, said second section having a second magnetic material capable of holding said first and said second sections together, wherein the second section includes a first piece of friction producing material, the friction producing material on an outer contact surface of the second section, having a ring shape adjacent to the second magnetic material.

8. The stand assembly of claim 7, wherein the second magnetic material directly interfaces with the curved surface.

9. The stand assembly of claim 7, wherein the second magnetic material contacts the curved surface.

10. The stand assembly of claim 7, wherein the front surface having an indentation, said indentation capable of receiving said curved end of said first section and being of a size which can encompass a portion, but less than the whole diameter, of said curved surface of said first section, said second section having the second magnetic material configured to securely attach to the first section through magnetic interaction of the curved surface of the first section with the indentation on the front surface of the second section.

11. The stand assembly of claim 7, wherein said first section further comprises a means for laying stably flat on a surface.

12. A stand assembly comprising:
a first section having a first end shaped with a curved surface, said curved surface of said first section constructed of a first magnetic material; and
a second section having a front surface, said front surface having an indentation, said indentation capable of receiving said curved end of said first section and being of a size which can encompass a portion, but less than the whole diameter, of said curved end of said first section, said second section having a second magnetic material capable of holding said first and said second sections together, wherein the second section includes a first piece of friction producing material, the friction producing material on an outer contact surface of the second section, surrounding the second magnetic material.

13. The stand assembly of claim 12, wherein the second magnetic material directly interfaces with the curved surface.

14. The stand assembly of claim 12, wherein the second magnetic material contacts the curved surface.

15. The stand assembly of claim 12, wherein the front surface having an indentation, said indentation capable of receiving said curved end of said first section and being of a size which can encompass a portion, but less than the whole diameter, of said curved surface of said first section, said second section having the second magnetic material configured to securely attach to the first section through magnetic interaction of the curved surface of the first section with the indentation on the front surface of the second section.

16. The stand assembly of claim 12, wherein said second section further comprises a back surface with a means for attaching to a surface.

17. The stand assembly of claim 12, wherein said second section further comprises being contiguous with a protective cover.

18. The stand assembly of claim 12, wherein said first section further comprises a means for attaching to a flat surface.

19. The stand assembly of claim 12, wherein said first section further comprises a means for laying stably flat on a surface.

* * * * *